(12) United States Patent
Gao et al.

(10) Patent No.: US 9,735,194 B2
(45) Date of Patent: Aug. 15, 2017

(54) X-RAY FLAT PANEL DETECTOR AND X-RAY DIGITAL RADIOGRAPHY SYSTEM

(71) Applicant: BOE TECHNOLOGY GROUP CO., LTD., Beijing (CN)

(72) Inventors: Jincheng Gao, Beijing (CN); Zhanfeng Cao, Beijing (CN); Xiangchun Kong, Beijing (CN); Qi Yao, Beijing (CN); Zhengliang Li, Beijing (CN); Bin Zhang, Beijing (CN); Xiaolong He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/088,177

(22) Filed: Apr. 1, 2016

(65) Prior Publication Data

US 2016/0336373 A1    Nov. 17, 2016

(30) Foreign Application Priority Data

May 11, 2015    (CN) .......................... 2015 1 0236165

(51) Int. Cl.
*H01L 27/146* (2006.01)
*G01T 1/20* (2006.01)
*G01T 1/24* (2006.01)

(52) U.S. Cl.
CPC ...... *H01L 27/14663* (2013.01); *G01T 1/2018* (2013.01); *G01T 1/241* (2013.01); *H01L 27/14612* (2013.01)

(58) Field of Classification Search
CPC ......... H01L 27/14658; H01L 27/14692; H01L 27/14609; H01L 27/14659; H01L 27/14676; H01L 27/14643; H01L 31/115
See application file for complete search history.

(56) References Cited

U.S. PATENT DOCUMENTS

| 5,581,087 A | 12/1996 | Uddin et al. |
| 8,476,596 B2 * | 7/2013 | Shin .................. H01L 27/14658 250/370.01 |

(Continued)

FOREIGN PATENT DOCUMENTS

| CN | 1256065 C | 5/2006 |
| CN | 101159283 A | 4/2008 |
| CN | 104218045 A | 12/2014 |

OTHER PUBLICATIONS

First Office Action regarding Chinese Application No. 201510236165.3, dated Apr. 19, 2017. Translation provided by Dragon Intellectual Property Law Firm.

*Primary Examiner* — Roy Potter
(74) *Attorney, Agent, or Firm* — Harness, Dickey & Pierce, P.L.C.

(57) ABSTRACT

The present disclosure provides an X-ray flat panel detector including: a base substrate; thin film transistors (TFTs), a pixel electrode layer, photodiodes, a transparent electrode layer, and an X-ray conversion layer which are arranged on the base substrate; and an electric field application portion configured to generate an electric field, wherein the photodiodes are arranged in the electric field, and a moving direction of negative charges when visible light rays are converted to electrical signals by the photodiodes is substantially same as a direction of the electric field. In this detector, it is applied a direction of the electric field which is substantially same as the moving direction of negative charges in the photodiode, so that movement of holes and electrons of the photodiode may be accelerated under an influence of the electric field, and thus the electrical signal may promptly arrive at the pixel electrode. As a result, it is improved the quantum detection efficiency and the sensitivity of the X-ray flat panel detector.

18 Claims, 5 Drawing Sheets

(56) References Cited

U.S. PATENT DOCUMENTS

2003/0223534 A1 12/2003 Sato et al.
2008/0224053 A1 9/2008 Shen
2011/0012022 A1* 1/2011 Lee .................. H01L 27/14676
250/370.09

* cited by examiner

X-RAY FLAT PANEL DETECTOR AND X-RAY DIGITAL RADIOGRAPHY SYSTEM

CROSS REFERENCE OF RELATED APPLICATION

The present application claims the priority of Chinese patent application No. 201510236165.3 filed on May 11, 2015, the disclosure of which is incorporated herein by reference.

TECHNICAL FIELD

The present disclosure relates to a technical field of flat panel detection, and in particular to an X-ray flat panel detector and an X-ray digital radiography system.

BACKGROUND

An X-ray detection is widely used in fields such as medical treatment, safety inspection, non-intrusive examination and scientific research. A typical X-ray detection technique is the X-ray digital radiography (DR) detection technique which is emerged in the late 1990s. A flat panel detector is arranged in an X-ray DR system, and each pixel size of the flat panel detector may be less than 0.1 mm, so that the flat panel detector may capture an image that has good quality and high definition comparable with film photography, while the flat panel detector overcomes the shortcomings of the film photography and facilitates the digital image processing.

Based on the digital conversion modes, digital X-ray flat panel detectors may be classified into two categories: a direct DR X-ray flat panel detector and an indirect DR X-ray flat panel detector. The indirect DR X-ray flat panel detector includes an X-ray conversion layer formed by a scintillator (for example, cesium iodide) or a fluorophor (for example, gadolinium oxysulfide), photodiodes, thin film transistors (TFTs), pixel units, signal amplification units and signal reading units. In such indirect DR X-ray flat panel detector, the X-ray may be converted into an electrical signal by a scintillator layer or a fluorophor layer after the scintillator layer or the fluorophor layer is exposed by the X-ray, the electrical signal of each pixel unit is read out and converted into a digital signal by a TFT array, and the digital signal is transmitted to a digital image processing computer system to be synthesized into an X-ray image.

The electrical signal converted by the photodiode is collected mainly by drift movement which is driven by a build-in electric field; and the greater a strength of the build-in electric field is, the faster a speed of collecting the charges is. The strength of the build-in electric field of the photodiode depends on a doping concentration of boron atoms and phosphorus atoms in P-type and N-type materials of the photodiode. However, the doping concentration of boron atoms and phosphorus atoms is limited by a saturation concentration; and properties of the material deteriorate when the saturation concentration is exceeded. Furthermore, amorphous compositions in amorphous silicon material have defects such as dangling bonds, and thus the charges may be captured by the defects when the charges are collected, so that output efficiency is lowered, and both detection efficiency and sensitivity of the X-ray detector are reduced.

SUMMARY

An object of the present disclosure is to provide an X-ray flat panel detector, so as to improve quantum detection efficiency and sensitivity of the X-ray flat panel detector.

In one aspect, the present disclosure provides in some embodiments an X-ray flat panel detector, including: a base substrate; TFTs, a pixel electrode layer, photodiodes, a transparent electrode layer, and an X-ray conversion layer which are arranged on the base substrate; and an electric field application portion configured to generate an electric field, wherein the photodiodes are arranged in the electric field, and a moving direction of negative charges when visible light rays are converted to electrical signals by the photodiodes is substantially same as a direction of the electric field.

Alternatively, in the X-ray flat panel detector, the electric field application portion may include:

a positive electrode layer arranged between the base substrate and the photodiodes; and a negative electrode layer arranged between the X-ray conversion layer and the photodiodes, wherein the negative electrode layer is made of a transparent material.

Alternatively, in the X-ray flat panel detector, the negative electrode layer may be arranged between the transparent electrode layer and the X-ray conversion layer, and a light transmissible insulation layer may be arranged between the transparent electrode layer and the negative electrode layer.

Alternatively, in the X-ray flat panel detector, the transparent electrode layer and the negative electrode layer may be arranged at a same layer, made of a same material and insulated from each other.

Alternatively, in the X-ray flat panel detector, the transparent electrode layer may include a plurality of first transparent electrodes arranged in parallel and being of a strip-like shape, the negative electrode layer may include a plurality of first negative electrodes arranged in parallel and being of a strip-like shape, and the first transparent electrodes and the first negative electrodes may be arranged alternately and arranged substantially in parallel.

Alternatively, in the X-ray flat panel detector, the transparent electrode layer may further include second transparent electrodes which are substantially vertical to the first transparent electrodes and connected to the first transparent electrodes respectively; and the negative electrode layer may further include second negative electrodes which are substantially vertical to the first negative electrodes and connected to the first negative electrodes respectively.

Alternatively, in the X-ray flat panel detector, the positive electrode layer and source electrodes/drain electrodes of the TFTs may be arranged at a same layer and made of a same material, and a predetermined gap may be arranged between the positive electrode layer and the source electrodes/drain electrodes of the TFTs.

Alternatively, in the X-ray flat panel detector, the positive electrode layer and gate electrodes of the TFTs may be arranged at a same layer and made of a same material.

Alternatively, in the X-ray flat panel detector, the positive electrode layer and the pixel electrode layer may be arranged at a same layer, made of a same material and insulated from each other.

Alternatively, in the X-ray flat panel detector, an insulation layer may be arranged between the TFTs and the pixel electrode layer, and the pixel electrode layer may be connected to the source electrodes/drain electrodes of the TFTs through via holes in the insulation layer.

In a second aspect, the present disclosure provides in some embodiments an X-ray digital radiography system including any one of the above X-ray flat panel detectors.

The following advantageous effects may be obtained by at least one of the above technical solutions provided by the embodiments of the present disclosure:

It is applied a direction of the electric field which is substantially same as the moving direction of negative charges in the photodiode, so that movement of holes and electrons of the photodiode may be accelerated under an influence of the electric field, and thus the electrical signal may promptly arrive at the pixel electrode. As a result, it is improved the quantum detection efficiency and the sensitivity of the X-ray detector.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Hereinafter, it will be discussed in details associated with figures and embodiments for further clarifying objects, technical solutions and advantages of the present disclosure.

In this embodiment of the present disclosure, an X-ray flat panel detector includes: a base substrate; and TFTs, a pixel electrode layer, photodiodes, a transparent electrode layer, and an X-ray conversion layer which are arranged on the base substrate. The X-ray flat panel detector further includes an electric field application portion configured to generate an electric field. The photodiodes are arranged in the electric field, and a moving direction of negative charges when visible light rays are converted to electrical signals by the photodiodes is substantially same as a direction of the electric field.

In such an X-ray flat panel detector, it is applied a direction of the electric field which is substantially same as the moving direction of negative charges in the photodiode, so that movement of holes and electrons of the photodiode may be accelerated under an influence of the electric field, and thus the electrical signal may promptly arrive at the pixel electrode. As a result, it is improved the quantum detection efficiency and the sensitivity of the X-ray detector.

Figure 1:
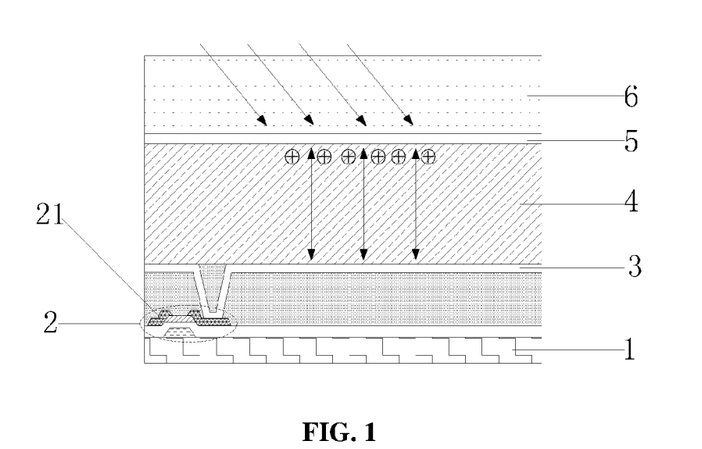
FIG. 1 is a sectional view showing a conventional X-ray flat panel detector.

FIG. 1 is the sectional view showing the conventional X-ray flat panel detector in related art. The conventional flat panel detector includes, from bottom to top, a substrate 1; and a TFT 2, a pixel electrode layer 3, a photodiode 4, a transparent electrode layer 5, and an X-ray conversion layer 6 which are arranged on the base substrate 1, wherein a source electrode/a drain electrode 21 of the TFT 2 is electrically connected to the pixel electrode layer 3 through a via hole.

In particular, the X-ray conversion layer 6 converts an incident X-ray to a visible light ray having a wavelength of about 550 nm, and the visible light ray is in a direction as indicated by the arrows in FIG. 1. The photodiode 4 converts the visible light ray to an electrical signal of positive and negative charges under an influence of irradiation of the visible light ray. As illustrated in FIG. 1, the positive charges are aggregated at one side of the photodiode 4 that is adjacent to the transparent electrode layer 5, while the negative charges are aggregated at the other side of the photodiode 4 that is adjacent to the pixel electrode layer 3. The pixel electrode layer 3 is arranged above the TFT 2, and each TFT 2 is covered by a pixel electrode of each pixel electrode layer 3. The TFT 2 is a two-dimensional electrical switch which obtains the charges of the electrical signal in the pixel electrode layer 3 by changing gate-controlled-voltage. The whole X-ray flat panel detector consists of a plurality of TFTs 2 and the pixel electrode layers 3. The charges stored in the pixel electrode layer 3 are read out by the TFT 2 line by line and stored in a signal storage unit (not shown). Then the signal is processed by amplification, analog-to-digital conversion (ADC), and etc, so as to obtain digital image information.

In contrast to the conventional X-ray flat panel detector, the X-ray flat panel detector according to the embodiment of the present disclosure further includes an electric field application portion configured to generate an electric field, wherein the photodiodes are arranged in the electric field, and a moving direction of negative charges when visible light rays are converted to electrical signals by the photodiodes is substantially same as a direction of the electric field. In particular, as illustrated in FIG. 1, the electric field application portion includes:

a positive electrode layer arranged between the base substrate 1 and the photodiode 4; and a negative electrode layer arranged between the X-ray conversion layer 6 and the photodiode 4, wherein the negative electrode layer is made of a transparent material.

The positive electrode layer and the negative electrode layer are arranged at the above positions, so that the photodiode 4 is arranged in the electric field, and the electric field is in a direction from the positive electrode layer to the negative electrode layer. In other words, the electric field is in a direction from the pixel electrode layer 3 to the transparent electrode layer 5, which is substantially same as a moving direction of negative charges when visible light ray is converted to electrical signal by the photodiode 4, so that movement of holes and electrons of the photodiode 4 may be accelerated, and thus the electrical signal may promptly arrive at the pixel electrode layer 2 while electron-hole recombination is reduced. As a result, it is improved the quantum detection efficiency and the sensitivity of the X-ray detector.

In particular, the positive electrode layer and the negative electrode layer are powered by an additional power source, and the electric field is applied as soon as the X-ray flat panel detector starts to operate. When the signal storage unit connected to the TFT 2 is full of signals, it returns a feedback signal to the electric field application portion, and the electric field between the positive electrode layer and the negative electrode layer is turned off accordingly.

In the present disclosure, the X-ray flat panel detector may have a variety of forms, and some example of such forms will be explained as follows.

First Embodiment

Figure 2:
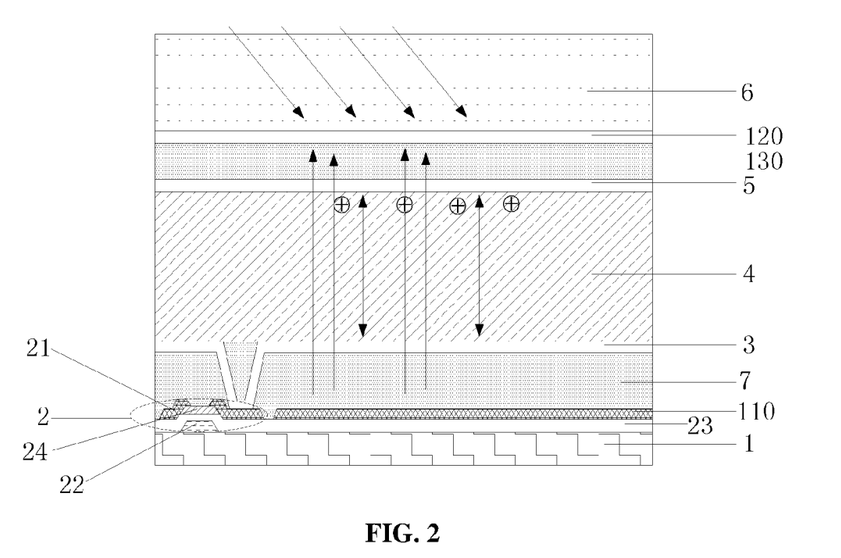
FIG. 2 is a sectional view showing an X-ray flat panel detector according to a first embodiment of the present disclosure.

FIG. 2 is a sectional view showing an X-ray flat panel detector according to the first embodiment of the present disclosure. As illustrated in FIG. 2, in this embodiment, in addition to the substrate 1, and the TFT 2, the pixel electrode layer 3, the photodiode 4, the transparent electrode layer 5, and the X-ray conversion layer 6 which are arranged on the base substrate 1, the X-ray flat panel detector further includes the positive electrode layer 110 and the negative electrode layer 120. The negative electrode layer 120 is made of the transparent material, and arranged between the transparent electrode layer 5 and the X-ray conversion layer 6. A light transmissible insulation layer 130 is further arranged between the transparent electrode layer 5 and the negative electrode layer 120, and the transparent electrode layer 5 and the X-ray conversion layer 6 are insulated from each other by the insulation layer 130. The positive electrode layer 110 is arranged between the pixel electrode layer 3 and the TFT 2. Alternatively, in this embodiment, the positive electrode layer 110 and the source electrode/the drain electrode 21 of the TFT 2 are arranged at a same layer and made of a same material, and a predetermined gap is arranged between the positive electrode layer 110 and the source electrode/the drain electrode 21 of the TFT 2.

In such an X-ray flat panel detector as illustrated in FIG. 2, the negative electrode layer 120 is made of the transparent material and arranged between the transparent electrode layer 5 and the X-ray conversion layer 6, and the positive electrode layer 110 and the source electrode/the drain electrode of the TFT 2 are arranged at the same layer and made of the same material, so that the photodiode 4 is arranged in the electric field formed by the positive electrode layer 110 and the negative electrode layer 120, and the moving direction of negative charges when visible light ray is converted to the electrical signal by the photodiode 4 is substantially same as the direction of the electric field. Therefore, the movement of holes and electrons of the photodiode 4 may be accelerated, and thus the electrical signal may promptly arrive at the pixel electrode layer 3. As a result, it is improved the quantum detection efficiency and the sensitivity of the X-ray detector.

In addition, since the positive electrode layer 110 and the source electrode/the drain electrode 21 of the TFT 2 are arranged at the same layer and made of the same material, the positive electrode layer 110 and the source electrode/the drain electrode 21 of the TFT 2 may be prepared by a one-time masking process, so that it is not necessary to add an independent procedure for preparing the positive electrode layer 110 in the process of manufacturing the X-ray flat panel detector.

Figure 3:
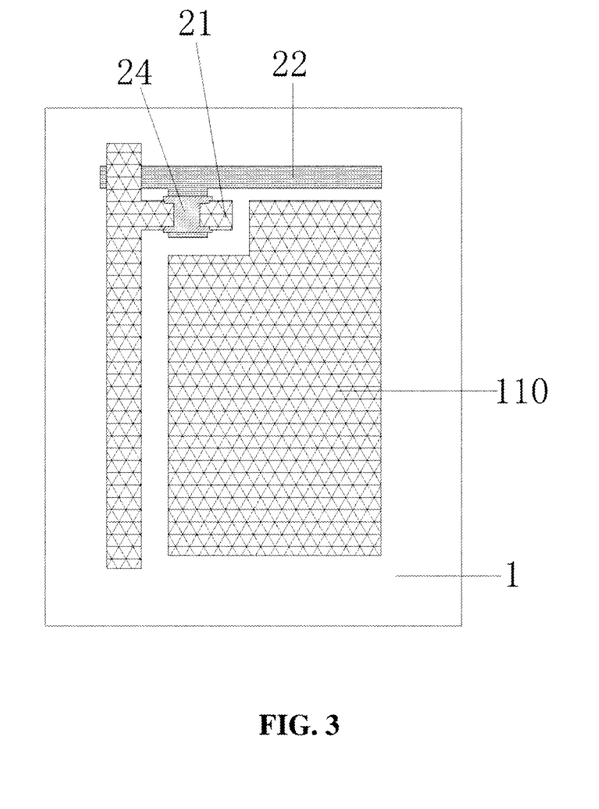
FIG. 3 is a further sectional view showing an X-ray flat panel detector according to the first embodiment of the present disclosure, wherein a positive electrode layer and source electrodes/drain electrodes of TFTs are arranged at a same layer and made of a same material.

FIG. 3 is a further sectional view showing an X-ray flat panel detector according to the first embodiment of the present disclosure, wherein the positive electrode layer 110 and the source electrode/the drain electrode 21 of TFT 2 are arranged at the same layer and made of the same material. In combination of FIG. 2 and FIG. 3, a method for manufacturing the X-ray flat panel detector of the first embodiment include steps of:

forming the gate electrode 22 of the TFT 2 on the base substrate 1;

forming the gate insulation layer 23 and the active layer 24 on the gate electrode 22 sequentially;

forming the source electrode/drain electrode 21 and the positive electrode layer 110 on the active layer 24, and separating the positive electrode layer 110 from the source electrode/the drain electrode 21, as illustrated in FIG. 3;

forming the insulation layer 7 on the source electrode/drain electrode 21 and the positive electrode layer 110, and forming a via hole in the insulation layer 7 and at a position corresponding to the source electrode/drain electrode 21;

forming the pixel electrode layer 3 on the insulation layer 7, wherein the pixel electrode layer 3 is connected to the source electrode/drain electrode 21 through the via hole; and forming the photodiode 4, the transparent electrode layer 5, the insulation layer 130, the negative electrode layer 120 and the X-ray conversion layer 6 sequentially on the pixel electrode layer 3.

The X-ray flat panel detector of the first embodiment may be prepared by the above steps. The process and means for forming such layers are know in the art, and therefore are not further explained, so as to do not obscure the principle of the present disclosure.

Second Embodiment

Figure 4:
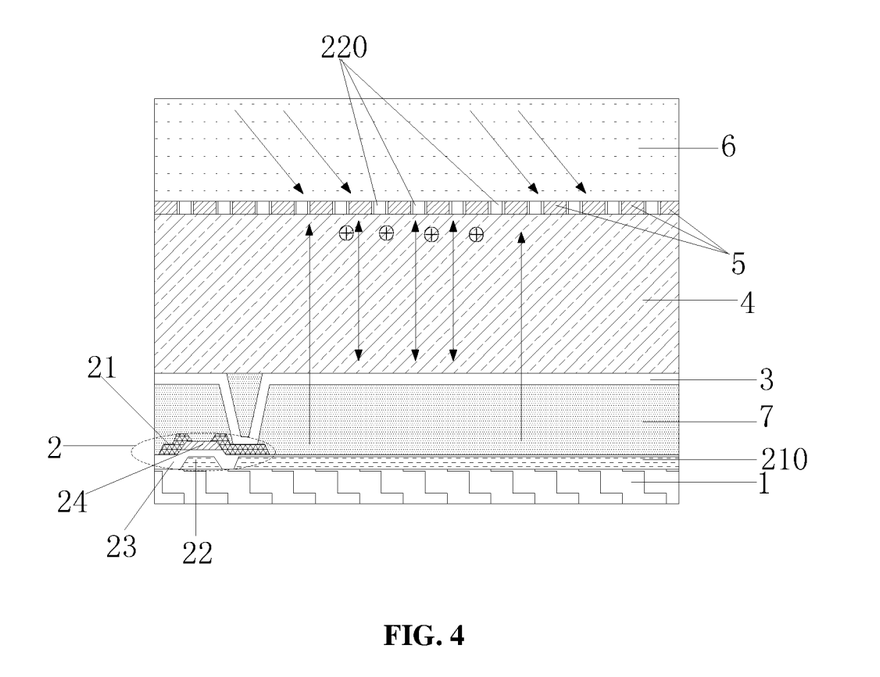
FIG. 4 is a sectional view showing an X-ray flat panel detector according to a second embodiment of the present disclosure.

FIG. 4 is a sectional view showing an X-ray flat panel detector according to the second embodiment of the present disclosure. As illustrated in FIG. 4, in this embodiment, in addition to the substrate 1, and the TFT 2, the pixel electrode layer 3, the photodiode 4, the transparent electrode layer 5, and the X-ray conversion layer 6 which are arranged on the base substrate 1, the X-ray flat panel detector further includes the positive electrode layer 210 and the negative electrode layer 220, and the negative electrode layer 220 is made of the transparent material. In particular, the transparent electrode layer 5 and the negative electrode layer 220 are arranged at the same layer, made of the same material and insulated from each other; and the positive electrode layer 210 and the gate electrode 22 of the TFT 2 are arranged at the same layer and made of the same material.

Figure 5:
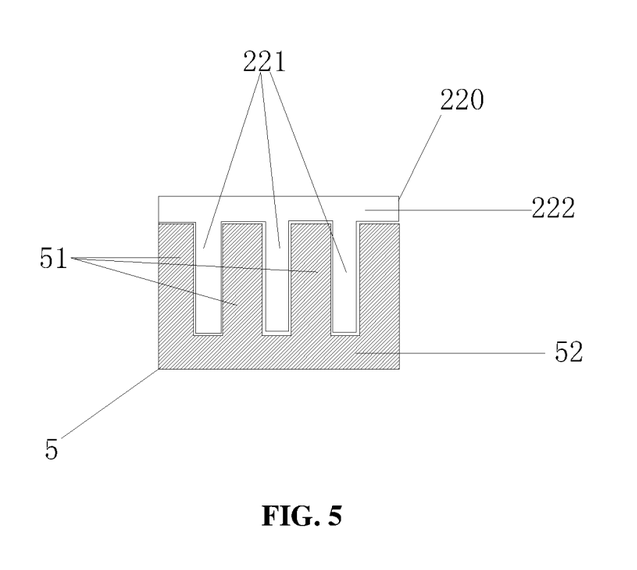
FIG. 5 is a schematic view showing a transparent electrode layer and a negative electrode layer according to a second embodiment of the present disclosure.

Alternatively, the electrodes of the transparent electrode layer 5 and the electrodes of the negative electrode layer 220 are of strip-like shapes, and arranged alternately and separately. As illustrated in FIG. 5, the transparent electrode layer 5 includes a plurality of first transparent electrodes 51 arranged in parallel and being of a strip-like shape, the negative electrode layer 220 includes a plurality of first negative electrodes 221 arranged in parallel and being of a strip-like shape, the first transparent electrodes 51 and the first negative electrodes 221 are arranged alternately and arranged in parallel, and the neighboring ones among the first negative electrode 221 and the first transparent electrode 51 are separated from each other. Furthermore, the transparent electrode layer 5 further includes second transparent electrodes 52 which are substantially vertical to the first transparent electrodes 51 and connected to the first transparent electrodes 51 respectively; and the negative electrode layer 220 further includes second negative electrodes 222 which are substantially vertical to the first negative electrodes 221 and connected to the first negative electrodes 221 respectively.

The first transparent electrodes 51 are connected to each other by the second transparent electrode 52 of the transparent electrode layer 5, so that the control signal may be inputted to the whole transparent electrode layer 5. The first negative electrodes 221 are connected to each other by the second negative electrode 222 of the negative electrode layer 220, so that the voltage signal may be inputted to the whole negative electrode layer 220.

In such an X-ray flat panel detector as illustrated in FIG. 4, the negative electrode layer 220 is arranged at the same layer, made of the same material as the transparent electrode layer 5 and insulated from the transparent electrode layer 5, and the positive electrode layer 210 is arranged at the same layer and made of the same material as the gate electrode 22 of the TFT 2, so that the photodiode 4 is arranged in the electric field formed by the positive electrode layer 210 and the negative electrode layer 220, and the moving direction of negative charges when visible light ray is converted to the electrical signal by the photodiode 4 is substantially same as the direction of the electric field. Therefore, the movement of holes and electrons of the photodiode 4 may be accelerated, and thus the electrical signal may promptly arrive at the pixel electrode layer 3. As a result, it is improved the quantum detection efficiency and the sensitivity of the X-ray detector.

In addition, since the transparent electrode layer 5 and the negative electrode layer 220 are arranged at the same layer, and the positive electrode layer 210 and the gate electrode 22 of the TFT 2 are arranged at the same layer, the negative electrode layer 220 and the transparent electrode layer 5 may be prepared by a one-time masking process, and the positive electrode layer 210 and the gate electrode 22 of the TFT 2 may be prepared by another one-time masking process, so that it is not necessary to add independent procedures for preparing the positive electrode layer 210 and the negative electrode layer 220 in the process of manufacturing the X-ray flat panel detector.

Figure 6:
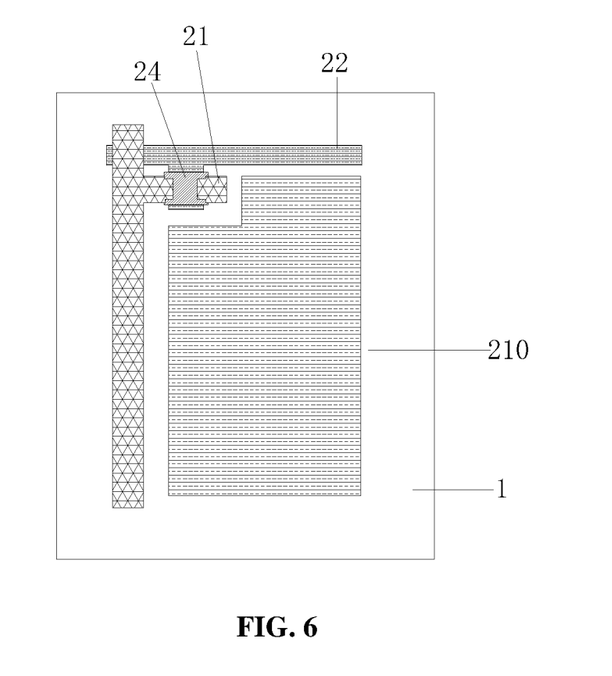
FIG. 6 is a schematic view showing a positive electrode layer and drain electrodes of the TFTs arranged at a same layer and made of a same material according to the second embodiment of the present disclosure.

FIG. 6 is a schematic view showing the X-ray flat panel detector according to the second embodiment of the present disclosure, wherein the positive electrode layer 210 and the gate electrode 22 of the TFT 2 are arranged at the same layer and made of the same material. In combination of FIG. 4 and FIG. 6, a method for manufacturing the X-ray flat panel detector of the second embodiment includes steps of:

forming the gate electrode 22 of the TFT 2 and the positive electrode layer 210 on the base substrate 1 by the one-time making process, and separating the gate electrode 22 and the positive electrode layer 210 from each other, as illustrated in FIG. 6;

forming the gate insulation layer 23 and the active layer 24 on the gate electrode 22 and the positive electrode layer 210 sequentially;

forming the source electrode/drain electrode 21 on the active layer 24;

forming the insulation layer 7 on the source electrode/drain electrode 21, and forming a via hole in the insulation layer 7 and at a position corresponding to the source electrode/the drain electrode 21;

forming the pixel electrode layer 3 on the insulation layer 7, wherein the pixel electrode layer 3 is connected to the source electrode/drain electrode 21 through the via hole;

forming the photodiode 4 on the pixel electrode layer 3;

forming the transparent electrode layer 5 and the negative electrode layer 220 on the photodiode 4 by the one-time patterning process, as illustrated in FIG. 5; and forming the X-ray conversion layer 6 on the transparent electrode layer 5 and the negative electrode layer 220.

The processes of forming the positive electrode layer 210 and the negative electrode layer 220 are known in the art, and thus are not further explained.

Third Embodiment

Figure 7:
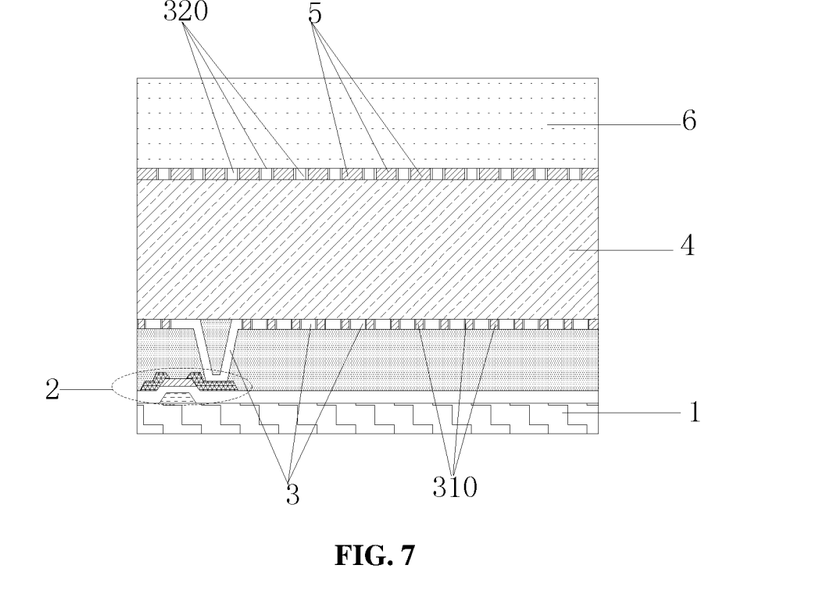
FIG. 7 is a sectional view showing an X-ray flat panel detector according to a third embodiment of the present disclosure.

FIG. 7 is a sectional view showing an X-ray flat panel detector according to the third embodiment of the present disclosure. As illustrated in FIG. 7, in this embodiment, in addition to the substrate 1, and the TFT 2, the pixel electrode layer 3, the photodiode 4, the transparent electrode layer 5, and the X-ray conversion layer 6 which are arranged on the base substrate 1, the X-ray flat panel detector further includes the positive electrode layer 310 and the negative electrode layer 320, and the negative electrode layer 320 is made of the transparent material. In particular, the transparent electrode layer 5 and the negative electrode layer 320 are arranged at the same layer, made of the same material and insulated from each other; and the positive electrode layer 310 and the pixel electrode layer 3 are arranged at the same layer, made of the same material and insulated from each other.

Alternatively, the electrodes of the transparent electrode layer 5 and the electrodes of the negative electrode layer 320 are of strip-like shapes, and arranged alternately and separately; and the neighboring ones among electrodes of the transparent electrode layer 5 and the electrodes of the negative electrode layer 320 are separated from each other, as illustrated in FIG. 5. In addition, the electrodes of the positive electrode layer 310 and the electrodes of the pixel electrode layer 3 may also be of strip-like shapes and arranged alternately and separately, which are substantially same as the transparent electrode layer 5 and the negative electrode layer 320 in configuration, wherein the electrodes of the positive electrode layer 310 and the electrodes of the pixel electrode layer 3 are arranged alternately, and the neighboring ones among the electrodes of the positive electrode layer 310 and the electrodes of the pixel electrode layer 3 are separated from each other.

The positive electrode layer 310 and the negative electrode layer 320 are arranged as above, so that the electric field is generated between two sides of the photodiode 4, and the moving direction of the negative charges when visible light ray is converted to the electrical signal by the photodiode 4 is substantially same as the direction of the electric field, so that movement of holes and electrons of the photodiode 4 may be accelerated, and thus the electrical signal may promptly arrive at the pixel electrode layer 3. As a result, it is improved the quantum detection efficiency and the sensitivity of the X-ray detector.

The above first, second and third embodiments are merely some of the preferred embodiments for generating the electric field between the two sides of the photodiode in the X-ray flat panel detector according to the principle of the present disclosure. However, the X-ray flat panel detector of the present disclosure is not limited thereto. The arrangement of the positive electrode layer and the negative electrode layer is not limited to the above three embodiments. For example, in another embodiment, the negative electrode layer is arranged between the transparent electrode layer and the X-ray conversion layer, the positive electrode layer and the gate electrode of the TFT are arranged at the same layer; in yet another embodiment, the transparent electrode layer and the negative electrode layer are arranged at the same layer and insulated from each other, and the positive electrode layer and the source electrode/the drain electrode of the TFT are arranged at the same layer.

The optional embodiments of the present disclosure have been discussed. It is appreciated that many modifications and polishes may be made to the present disclosure without departing from the principle of the present disclosure for those skilled in the art. These modifications and polishes should also be deemed to be fallen within the scope of the present disclosure.

What is claimed is:

1. An X-ray flat panel detector, comprising:
   a base substrate;
   thin film transistors (TFTs), a pixel electrode layer, photodiodes, a transparent electrode layer, and an X-ray conversion layer which are arranged on the base substrate; and
   an electric field application portion configured to generate an electric field in a direction from the base substrate to the X-ray conversion layer,
   wherein the photodiodes are arranged in the electric field, and a moving direction of positive charges when visible light rays are converted to electrical signals by the photodiodes is substantially same as a direction of the electric field,
   wherein the electric field application portion comprises:
   a positive electrode layer arranged between the base substrate and the photodiodes; and
   a negative electrode layer arranged between the X-ray conversion layer and the photodiodes, wherein the negative electrode layer is made of a transparent material.

2. The X-ray flat panel detector according to claim 1, wherein the negative electrode layer is arranged between the transparent electrode layer and the X-ray conversion layer, and a light transmissible insulation layer is arranged between the transparent electrode layer and the negative electrode layer.

3. The X-ray flat panel detector according to claim 1, wherein the transparent electrode layer and the negative electrode layer are arranged at a same layer, made of a same material and insulated from each other.

4. The X-ray flat panel detector according to claim 3, wherein the transparent electrode layer comprises a plurality of first transparent electrodes arranged in parallel and being of a strip-like shape, wherein the negative electrode layer comprises a plurality of first negative electrodes arranged in parallel and being of a strip-like shape, and wherein the first transparent electrodes and the first negative electrodes are arranged alternately and arranged substantially in parallel.

5. The X-ray flat panel detector according to claim 4, wherein the transparent electrode layer further comprises second transparent electrodes which are substantially vertical to the first transparent electrodes and connected to the first transparent electrodes respectively; and
   wherein the negative electrode layer further comprises second negative electrodes which are substantially vertical to the first negative electrodes and connected to the first negative electrodes respectively.

6. The X-ray flat panel detector according to claim 1, wherein the positive electrode layer and source electrodes/drain electrodes of the TFTs are arranged at a same layer and made of a same material, and wherein a predetermined gap is arranged between the positive electrode layer and the source electrodes/drain electrodes of the TFTs.

7. The X-ray flat panel detector according to claim 1, wherein the positive electrode layer and gate electrodes of the TFTs are arranged at a same layer and made of a same material.

8. The X-ray flat panel detector according to claim 1, wherein the positive electrode layer and the pixel electrode layer are arranged at a same layer, made of a same material and insulated from each other.

9. The X-ray flat panel detector according to claim 1, wherein an insulation layer is arranged between the TFTs and the pixel electrode layer, and wherein the pixel electrode layer is connected to the source electrodes/drain electrodes of the TFTs through via holes in the insulation layer.

10. An X-ray digital radiography system, comprising an X-ray flat panel detector, wherein the X-ray flat panel detector comprises:
    a base substrate;
    thin film transistors (TFTs), a pixel electrode layer, photodiodes, a transparent electrode layer, and an X-ray conversion layer which are arranged on the base substrate; and
    an electric field application portion configured to generate an electric field orientated from the base substrate to the X-ray conversion layer,
    wherein the photodiodes are arranged in the electric field, and a moving direction of positive charges when visible light rays are converted to electrical signals by the photodiodes is substantially same as a direction of the electric field,
    wherein the electric field application portion comprises:
    a positive electrode layer arranged between the base substrate and the photodiodes; and
    a negative electrode layer arranged between the X-ray conversion layer and the photodiodes, wherein the negative electrode layer is made of a transparent material.

11. The X-ray digital radiography system according to claim 10, wherein the negative electrode layer is arranged between the transparent electrode layer and the X-ray conversion layer, and a light transmissible insulation layer is arranged between the transparent electrode layer and the negative electrode layer.

12. The X-ray digital radiography system according to claim 10, wherein the transparent electrode layer and the negative electrode layer are arranged at a same layer, made of a same material and insulated from each other.

13. The X-ray digital radiography system according to claim 12, wherein the transparent electrode layer comprises a plurality of first transparent electrodes arranged in parallel and being of a strip-like shape, wherein the negative electrode layer comprises a plurality of first negative electrodes arranged in parallel and being of a strip-like shape, and wherein the first transparent electrodes and the first negative electrodes are arranged alternately and arranged substantially in parallel.

14. The X-ray digital radiography system according to claim 13, wherein the transparent electrode layer further comprises second transparent electrodes which are substantially vertical to the first transparent electrodes and connected to the first transparent electrodes respectively; and
wherein the negative electrode layer further comprises second negative electrodes which are substantially vertical to the first negative electrodes and connected to the first negative electrodes respectively.

15. The X-ray digital radiography system according to claim 10, wherein the positive electrode layer and source electrodes/drain electrodes of the TFTs are arranged at a same layer and made of a same material, and wherein a predetermined gap is arranged between the positive electrode layer and the source electrodes/drain electrodes of the TFTs.

16. The X-ray digital radiography system according to claim 10, wherein the positive electrode layer and gate electrodes of the TFTs are arranged at a same layer and made of a same material.

17. The X-ray digital radiography system according to claim 10, wherein the positive electrode layer and the pixel electrode layer are arranged at a same layer, made of a same material and insulated from each other.

18. The X-ray digital radiography system according to claim 10, wherein an insulation layer is arranged between the TFTs and the pixel electrode layer, and wherein the pixel electrode layer is connected to the source electrodes/drain electrodes of the TFTs through via holes in the insulation layer.

* * * * *